US008445775B2

(12) United States Patent
Shinohara

(10) Patent No.: US 8,445,775 B2
(45) Date of Patent: May 21, 2013

(54) SOLAR CELL MODULE

(75) Inventor: Wataru Shinohara, Ohgaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 672 days.

(21) Appl. No.: 12/593,186

(22) PCT Filed: Feb. 20, 2009

(86) PCT No.: PCT/JP2009/053033
§ 371 (c)(1),
(2), (4) Date: Nov. 2, 2009

(87) PCT Pub. No.: WO2009/104737
PCT Pub. Date: Aug. 27, 2009

(65) Prior Publication Data
US 2010/0300517 A1 Dec. 2, 2010

(30) Foreign Application Priority Data
Feb. 21, 2008 (JP) .................................. 2008-040717

(51) Int. Cl.
*H01L 31/042* (2006.01)
(52) U.S. Cl.
USPC ............................ 136/244; 136/261; 136/256
(58) Field of Classification Search
USPC ................................................ 136/249, 261
See application file for complete search history.

(56) References Cited

U.S. PATENT DOCUMENTS

| 6,168,968 B1 * | 1/2001 | Umemoto et al. ............... 438/96 |
| 2002/0066478 A1 * | 6/2002 | Hayashi et al. ................ 136/244 |
| 2004/0144420 A1 * | 7/2004 | Takeyama et al. ............ 136/256 |

FOREIGN PATENT DOCUMENTS

| JP | 2000-252489 A | 9/2000 |
| JP | 2002-261308 A | 9/2002 |
| JP | 2003-046099 A | 2/2003 |
| JP | 2003-273383 A | 9/2003 |
| JP | 2006-313872 A | 11/2006 |
| JP | 2007-324633 A | 12/2007 |
| WO | WO 2009/104737 A1 | 8/2009 |

OTHER PUBLICATIONS

International Search Report for PCT/JP2009/053033, dated May 19, 2009, pp. 1-5.

* cited by examiner

*Primary Examiner* — Miriam Berdichevsky
(74) *Attorney, Agent, or Firm* — Ditthavong Mori & Steiner, P.C.

(57) ABSTRACT

A solar cell module includes a first isolation groove for separating the first electrode layer; a second isolation groove for separating each of the first semiconductor layer, the transparent conductive layer, and the second semiconductor layer; and a third isolation groove formed in a position opposite from the first isolation groove across the second isolation groove and for separating each of the second electrode layer, the second semiconductor layer, the transparent conductive layer, and the first semiconductor layer. The second electrode layer includes: a first conductive layer formed on the first semiconductor layer constituting a bottom surface of the second isolation groove, on an inner wall of the second isolation groove, and on the second semiconductor layer; and a second conductive layer formed on the first conductive layer. A resistivity of the first conductive layer is higher than a resistivity of the second conductive layer, and the first conductive layer is filled on the first electrode layer constituting the bottom surface of the second isolation groove, up to at least a position of an interface between the transparent conductive layer and the second conductive layer.

3 Claims, 7 Drawing Sheets

(a)

(b)

(c)

(d)

(e)

(a)

(b)

(c)

SOLAR CELL MODULE

TECHNICAL FIELD

The present invention relates to a solar cell module provided with a transparent conductive layer between a first semiconductor layer and a second semiconductor layer.

BACKGROUND ART

In general, a solar cell module of a thin film type includes a first electrode layer separated by a first isolation groove, a first semiconductor layer, a transparent conductive layer and a second semiconductor layer which are separated by a second isolation groove, and a second electrode layer separated by a third isolation groove. Such a solar cell module is fabricated as described below.

First, the first electrode layer is formed on a substrate having transparency, and thereafter the first isolation groove is formed by partially removing the first electrode layer by use of laser. Next, the first semiconductor layer is formed on the first electrode layer and simultaneously is filled into the first isolation groove. Next, the transparent conductive layer and the second semiconductor layer are sequentially formed on the first semiconductor layer.

Next, the second isolation groove is formed by partially removing the first semiconductor layer, the transparent conductive layer, and the second semiconductor layer by use of laser. Next, the second electrode layer is formed on an inner wall of the second isolation groove and on the second semiconductor layer. Next, the third isolation groove is formed in a position opposite from the first isolation groove across the second isolation groove, by partially removing the first semiconductor layer, the transparent conductive layer, the second semiconductor layer, and the second electrode layer by use of laser.

In such a solar cell module, since the transparent conductive layer contacts the second electrode layer formed on the inner wall of the second isolation groove, a current flowing along the second electrode layer flows into the transparent conductive layer, and therefore a leak current occurs.

In order to prevent the occurrence of the leak current from the second electrode layer to the transparent conductive layer, it is known that a transparent conductive layer isolation groove for separating the transparent conductive layer is formed by partially removing the transparent conductive layer between the first isolation groove and the second isolation groove (see Japanese Patent Application Publication No. 2002-261308, for example).

Here, a voltage potential difference between the first semiconductor layer and the second semiconductor layer is small in a region between the first isolation groove and the second isolation groove. If the width of this region is increased, the amount of the current that can be taken out of the first semiconductor layer and the second semiconductor layer is decreased. It is therefore preferable to form such a region having as small width as possible.

However, if the transparent conductive layer isolation groove is formed between the first isolation groove and the second isolation groove, the width between the first isolation groove and the second isolation groove is increased, as compared to the case where the transparent conductive layer isolation groove is not formed.

Therefore, although the occurrence of the leak current between the second electrode layer and the transparent conductive layer can be prevented by forming the transparent conductive layer isolation groove, there is a problem the amount of the current that can be taken out of the first semiconductor layer and the second semiconductor layer is decreased.

Accordingly, the present invention has been made in view of the foregoing problem and an object of the present invention is to provide a solar cell module capable of preventing occurrence of a leak current between the second electrode layer and the transparent conductive layer without increasing the width of the region having a small voltage potential difference between the first semiconductor layer and the second semiconductor layer.

DISCLOSURE OF THE INVENTION

A solar cell module according to a feature of the present invention is formed by depositing a first electrode layer, a first semiconductor layer, a transparent conductive layer, a second semiconductor layer, and a second electrode layer sequentially on a principal surface of a substrate. The solar cell module comprises a first isolation groove for separating the first electrode layer, a second isolation groove for separating each of the first semiconductor layer, the transparent conductive layer and the second semiconductor layer, and a third isolation groove formed in a position opposite from the first isolation groove across the second isolation groove and for separating each of the second electrode layer, the second semiconductor layer, the transparent conductive layer, and the first semiconductor layer. The second electrode layer includes a first conductive layer formed on the first semiconductor layer constituting a bottom surface of the second isolation groove, on an inner wall of the second isolation groove and on the second semiconductor layer, and a second conductive layer formed on the first conductive layer. A resistivity of the first conductive layer is higher than a resistivity of the second conductive layer. The first conductive layer is filled on the first electrode layer constituting the bottom surface of the second isolation groove, up to at least a position of an interface between the transparent conductive layer and the second conductive layer.

According to the aspect of the present invention, the resistivity of the second conductive layer included in the second electrode layer is lower than the resistivity of the first conductive layer included in the second electrode layer. Therefore, the current generated in the first semiconductor layer and the second semiconductor layer mainly flows along the second conductive layer. Here, according to the aspect of the present invention, the first conductive layer is filled on the first electrode layer constituting the bottom surface of the second isolation groove, up to at least the position of the interface between the transparent conductive layer and the second conductive layer. According to this structure, each of the transparent conductive layer and the second conductive layer is separated by the first conductive layer having the higher resistivity than the second conductive layer, and thus a distance between the transparent conductive layer and the second conductive layer becomes longer. For this reason, the current flowing along the second conductive layer does not easily flow onto the transparent conductive layer. Therefore, according to the aspect of the present invention, it is possible to prevent the occurrence of the leak current between the second electrode layer and the transparent conductive layer without increasing the width of the region between the first isolation groove and the second isolation groove, i.e., the width of the region where the voltage potential difference between the first semiconductor layer and the second semiconductor layer is small.

BEST MODES FOR CARRYING OUT THE INVENTION

Figure 1:
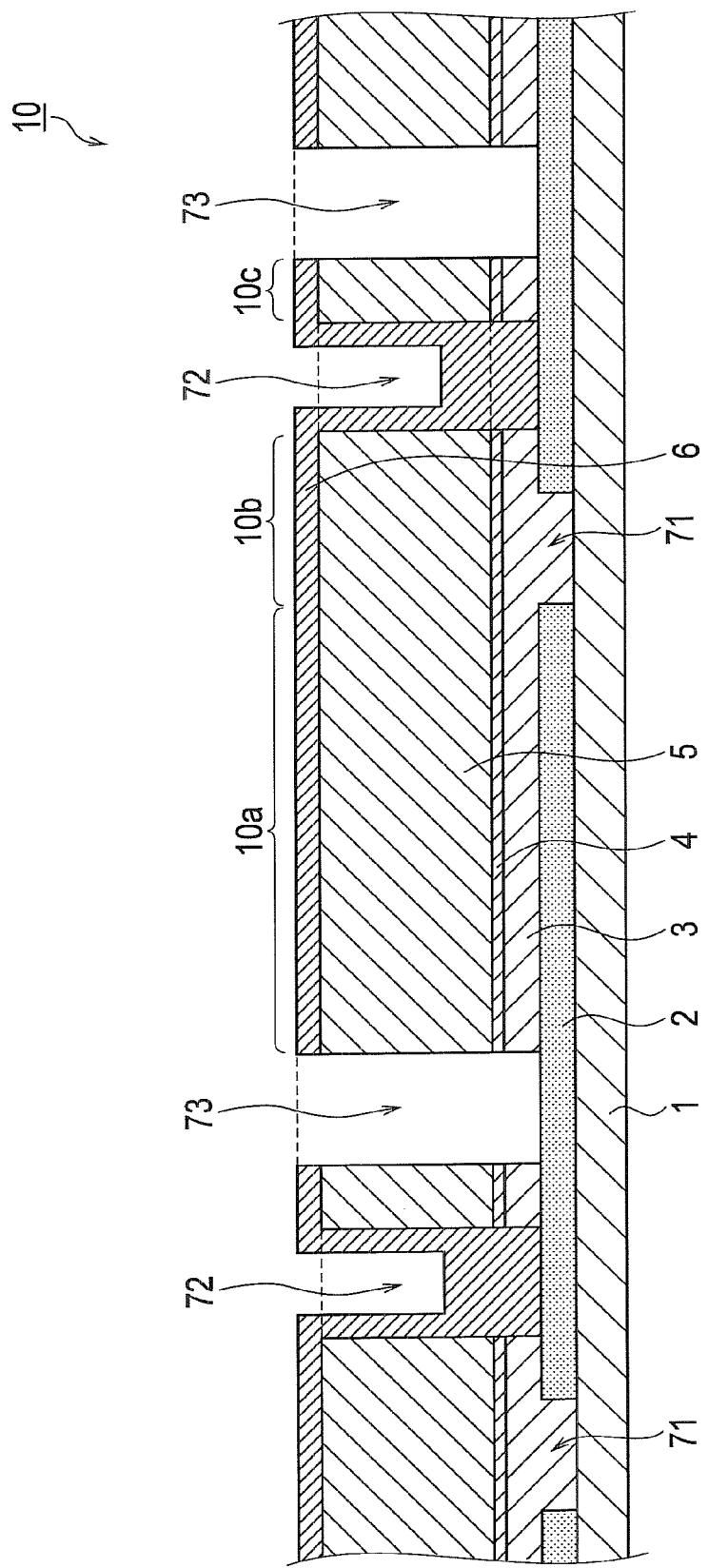
FIG. 1 is a cross-sectional view of a solar cell module 10 according to a first embodiment of the present invention.

Next, an embodiment of the present invention will be described by using the drawings. In the following description of the drawings, identical or similar constituents are designated by identical or similar reference numerals. It is to be noted, however, that the drawings are merely schematic, and proportions and the like of respective dimensions are different from their realities. The concrete dimensions and the like are therefore supposed to be determined in consideration of the following explanations. Moreover, it is needles to say that the drawings may contain portions where dimensional relations and proportions are different from one another.

First Embodiment

<Structure of Solar Cell Module>

A structure of a solar cell module according to a first embodiment of the present invention will be described below with reference to FIG. 1.

FIG. 1 is a cross-sectional view of a solar cell module 10 according to the first embodiment of the present invention. As shown in FIG. 1, on a principal surface of a substrate 1, the solar cell module 10 includes a first electrode layer 2, a first semiconductor layer 3, a transparent conductive layer 4, a second semiconductor layer 5, and a second electrode layer 6. The first electrode layer 2, the first semiconductor layer 3, the transparent conductive layer 4, the second semiconductor layer 5, and the second electrode layer 6 are deposited sequentially from the principal surface side of the substrate 1. Moreover, the solar cell module 10 includes a first isolation groove 71, a second isolation groove 72, and a third isolation groove 73. Meanwhile, the solar cell module 10 includes a first region 10a, a second region 10b, and a third region 10c.

Glass, a plastic or the like having transparency may be used as the substrate 1.

The first electrode layer 2 is deposited on the principal surface of the substrate 1 and has conductivity as well as transparency. A metal oxide such as indium oxide ($In_2O_3$), zinc oxide (ZnO), titanium oxide ($TiO_x$) or tin oxide ($SnO_2$) may be used as the first electrode layer 2. Here, these metal oxides may be doped with fluorine (F), tin (Sn), aluminum (Al), iron (Fe), gallium (Ga), niobium (Nb) or the like.

The first semiconductor layer 3 generates photogenerated carriers by using light incident from the first electrode layer 2 side. Moreover, the first semiconductor layer 3 generates photogenerated carriers by using light reflected from the transparent conductive layer 4 to be described later. The first semiconductor layer 3 has a pin junction (not shown) in which a p-type semiconductor, an i-type semiconductor, and an n-type semiconductor are deposited from the substrate 1 side. The i-type semiconductor constitutes a power generation layer in the first semiconductor layer 3. As the i-type semiconductor in the first semiconductor layer 3, amorphous silicon based semiconductor such as a-Si or a-SiC may be used. However, the structure is not limited to this.

The transparent conductive layer 4 has transparency as well as conductivity. The transparent conductive layer 4 transmits part of the light transmitted through the first semiconductor layer 3 toward a second semiconductor layer 5 side and reflects part of the light transmitted through the first semiconductor layer 3 back to a first semiconductor layer 3 side. A metal oxide such as ZnO, ITO or $TiO_x$ may be used as the transparent conductive layer 4. The transparent conductive layer 4 may be doped with a dopant such as Al. Meanwhile, a thin metal layer, a thin semiconductor layer, a combination of a thin insulating layer and a conductive layer, or the like may be used as the transparent conductive layer 4.

The second semiconductor layer 5 generates photogenerated carriers by using light incident from the first electrode layer 2 side and passing through the first electrode layer 2, the first semiconductor layer 3 and the transparent conductive layer 4. The second semiconductor layer 5 has a pin junction (not shown) in which a p-type semiconductor, an i-type semiconductor, and an n-type semiconductor are deposited from the substrate 1 side. The i-type semiconductor constitutes a power generation layer in the second semiconductor layer 5. As the i-type semiconductor in the second semiconductor layer 5, microcrystalline silicon based semiconductor such as μc-Si or μc-SiGe may be used. However, the structure is not limited to this.

The second electrode layer 6 has conductivity and is formed on a surface of the first electrode layer 2 constituting a bottom surface of the second isolation groove, on an inner wall of the second isolation groove 72, and on the second semiconductor layer 5. A structure of the second electrode layer 6 will be described later in detail.

The first isolation groove 71 separates the first electrode layer 2. The first semiconductor layer 3 is filled into the first isolation groove 71.

The second isolation groove 72 separates each of the first semiconductor layer 3, the transparent conductive layer 4, and the second semiconductor layer 5 on the first electrode layer 2. The bottom surface of the second isolation groove 72 is formed by a surface of the first electrode layer 2. The second electrode layer 6 is filled into the second isolation groove 72 up to a predetermined level.

The third isolation groove 73 separates each of the second electrode layer 6, the second semiconductor layer 5, the transparent conductive layer 4, and the first semiconductor layer 3. The third isolation groove 73 is formed in a position opposite from the first isolation groove 71 across the second isolation groove 72.

The first region 10a is a region between the first isolation groove 71 and the third isolation groove 73 adjacent to each other. Specifically, the first region 10a means a region: from the edge of the first isolation groove 71, on a side close to the third isolation groove 73 adjacent to the first isolation groove 71; to the edge of the third isolation groove 73, on a side close to the first isolation groove 71 adjacent to the third isolation groove. The first region 10a is a region that contributes to generation of a current.

The second region 10b is a region between the first isolation groove 71 and the second isolation groove 72 adjacent to each other. Specifically, the second region 10b means a region: from the edge of the first isolation groove 71, on a side close to the second isolation groove 72 adjacent to the first isolation groove 71; to the edge of the second isolation groove 72, on a side close to the first isolation groove 71 adjacent to the second isolation groove. The second region 10b is a region where the voltage potential difference between the first semiconductor layer 3 and the second semiconductor layer 5 becomes small and a region where it is difficult to take out the current generated on the first semiconductor layer 3 and the second semiconductor layer 5. Therefore, when the width of the second region 10b becomes smaller, the amount of the current that can be taken out of the solar cell module 10 is increased. When the width of the second region 10b becomes larger, the amount of the current that can be taken out of the solar cell module 10 is reduced.

The third region 10c is a region between the second isolation groove 72 and the third isolation groove 73 adjacent to each other. Specifically, the third region 10c means a region: from the edge of the second isolation groove 72, on a side close to the third isolation groove 73 adjacent to the second isolation groove 72; to the edge of the third isolation groove 73, on a side close to the second isolation groove 72 adjacent to the third isolation groove. The third region 10c is a region that does not contribute to generation of the current.

<Structure of Second Electrode Layer>

Figure 2:
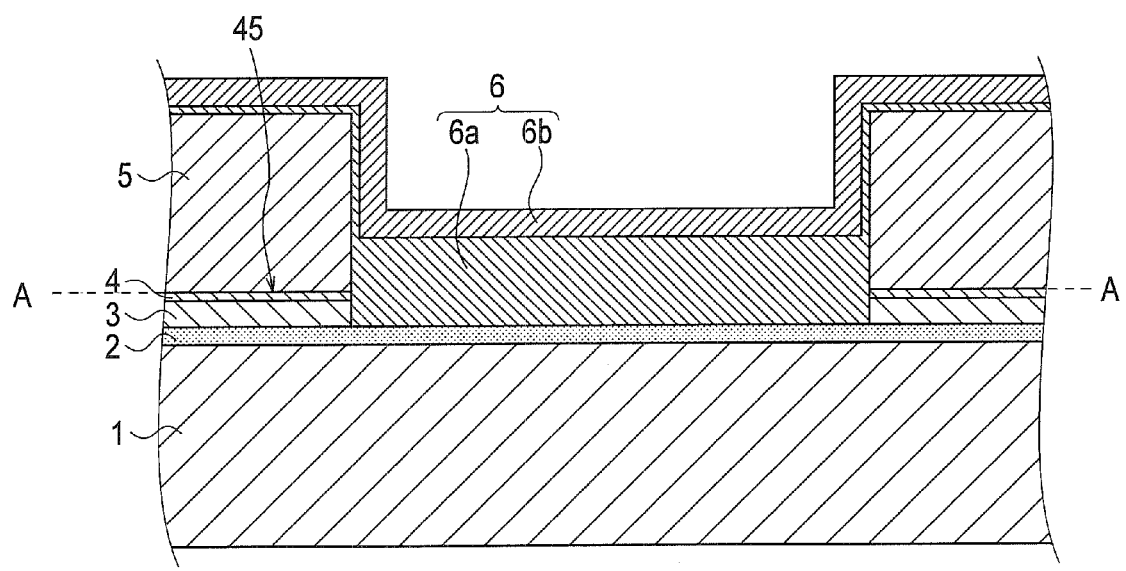
FIG. 2 is a partially enlarged view of FIG. 1.

Next, the structure of the second electrode layer 6 will be described with reference to FIG. 2. FIG. 2 is a partially enlarged view of FIG. 1. As shown in FIG. 2, the second electrode layer 6 includes a first conductive layer 6a and a second conductive layer 6b.

The first conductive layer 6a is formed on the surface of the first electrode layer 2 constituting the bottom surface of the second isolation groove, on the inner wall of the second isolation groove 72, and on the second semiconductor layer 5. The first conductive layer 6a has conductivity. The first conductive layer 6a transmits part of the light transmitted through the second semiconductor layer 5 toward a second conductive layer 6b side and reflects part of the light transmitted through the second conductive layer 6b back to a second semiconductor layer 5 side.

A material having higher resistivity than resistivity of the second conductive layer 6b is used as the first conductive layer 6a. Meanwhile, a material having a lower sheet resistance value than a sheet resistance value of the transparent conductive layer 4 may be used as the first conductive layer 6a. For example, a material having a sheet resistance value equal to or above 10 kΩ/□ and equal to or below 300 kΩ/□ may be used as the first conductive layer 6a.

Specifically, as the first conductive layer 6a, a metal oxide such as $In_2O_3$, ZnO, $TiO_x$ or $SnO_2$ may be used.

Alternatively, as the first conductive layer 6a, resin containing a conductive filler may be used. As the conductive filler, particles formed of a metal oxide such as $In_2O_3$, ZnO, $TiO_x$ or $SnO_2$ may be used, and as the resin, an acrylic resin or the like may be used. A maximum grain size of the conductive filler contained in the resin may be set equal to or above 50% relative to the thickness of the first conductive layer 6a to be formed on the second semiconductor layer. Meanwhile, volume occupancy of the conductive filler contained in the resin may be set equal to or above 30% of the volume of the resin containing the conductive filler.

Meanwhile, a polymer compound having conductivity, such as polyacetylene, polyparaphenylene, polythiophene, polypyrrole, polyaniline or polyacene, may be used as the first conductive layer 6a.

The second conductive layer 6b has conductivity and is formed on the first conductive layer 6a. As the second conductive layer 6b, silver (Ag) or the like may be used, but is not limited to this.

As shown in FIG. 2, the first conductive layer 6a is filled on the first electrode layer 2 constituting the bottom surface of the second isolation groove 72, up to at least an A-A line that indicates an interface 45 between the transparent conductive layer 4 and the second semiconductor layer 5.

The thickness of the first conductive layer 6a formed on the first electrode layer 2 constituting the bottom surface of the second isolation groove 72 is preferably about one-fiftieth of the width of the second isolation groove 72. For example, when the width of the second isolation groove 72 is 50 μm, the thickness of the first conductive layer 6a formed on the first electrode layer 2 constituting the bottom surface of the second isolation groove 72 is preferably about 1 μm.

<Method of Manufacturing Solar Cell Module>

Next, a method of manufacturing the solar cell module 10 according to the first embodiment of the present invention will be described with reference to FIG. 3 and FIG. 4.

Figure 3:
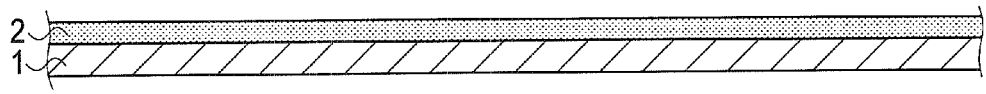
FIG. 3 is a view showing steps of manufacturing the solar cell module 10 according to the first embodiment of the present invention (No. 1).
Figure 3:
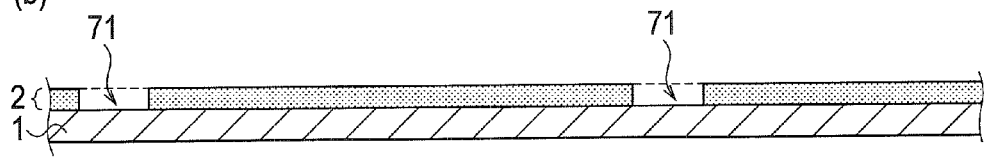
Figure 3:
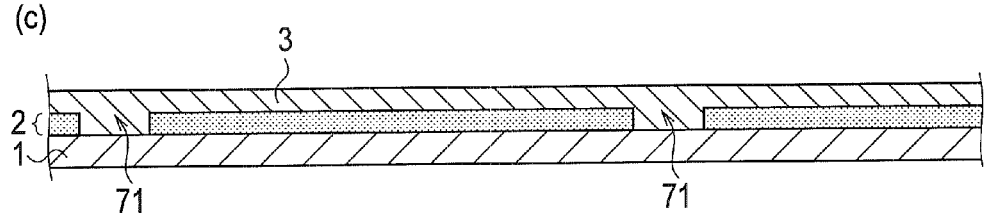
Figure 3:
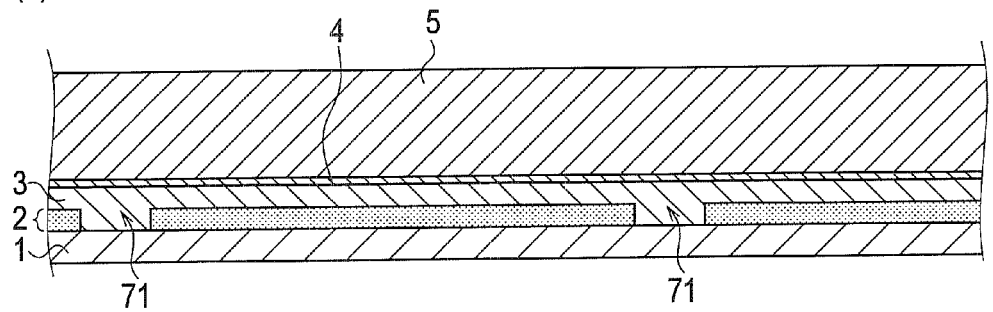
Figure 3:
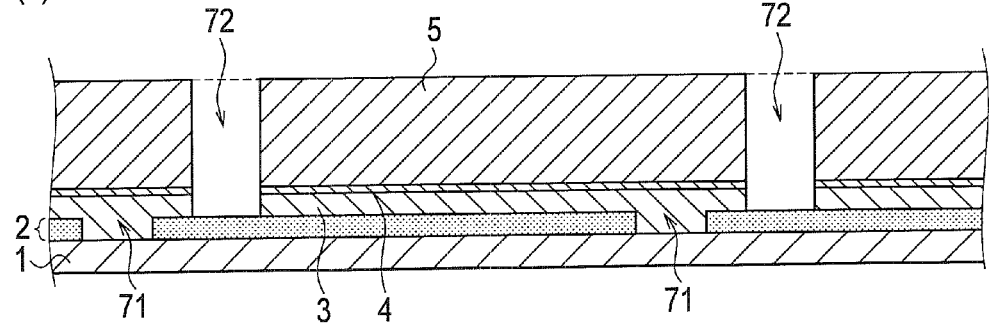
Figure 4:
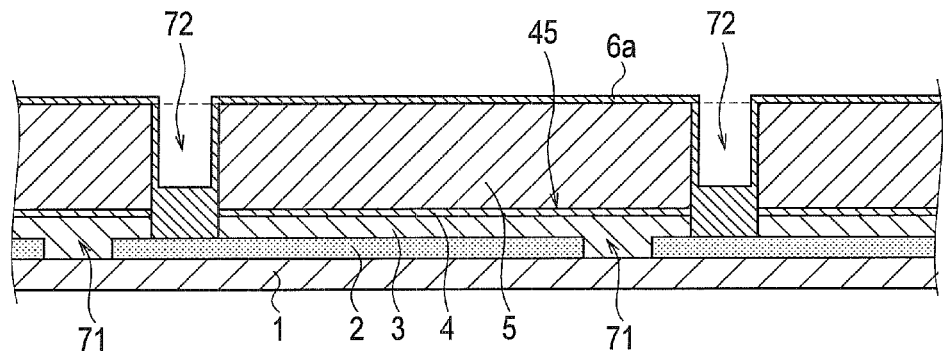
FIG. 4 is a view showing the steps of manufacturing the solar cell module 10 according to the first embodiment of the present invention (No. 2).
Figure 4:
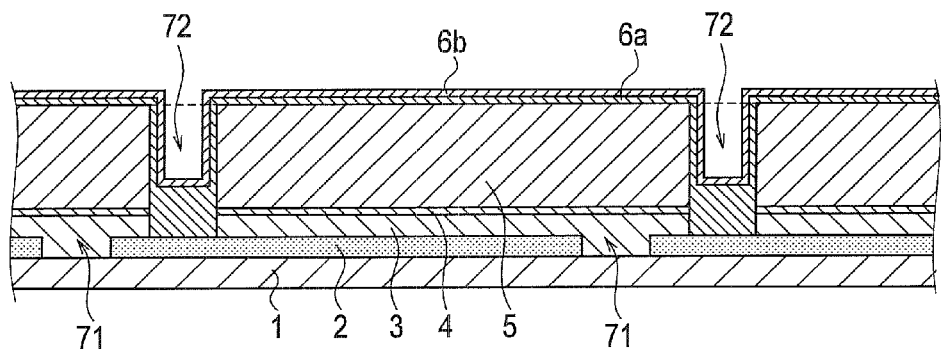
Figure 4:
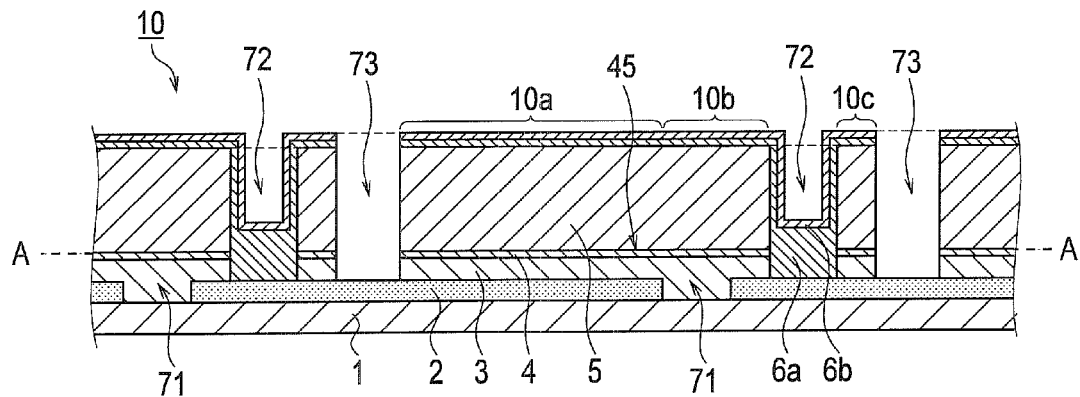

FIG. 3 and FIG. 4 are views showing steps of manufacturing the solar cell module 10 according to the first embodiment of the present invention.

First, as shown in Part (a) of FIG. 3, the first electrode layer 2 is formed on the principal surface of the substrate 1.

Then, part of the first electrode layer 2 is removed by irradiation of a laser beam. In this way, the first isolation groove 71 for separating the first electrode layer 2 is formed as shown in Part (b) of FIG. 3. Here, a mask may be used when the first electrode layer 2 is formed so as to include the first isolation groove 71.

Next, as shown in Part (c) of FIG. 3, the first semiconductor layer 3 is formed on the first electrode layer 2 by using a CVD method such as a RF plasma CVD method, and the first semiconductor layer 3 is filled into the first isolation groove 71.

Next, as shown in Part (d) of FIG. 3, the transparent conductive layer 4 and the second semiconductor layer 5 are sequentially formed on the first semiconductor layer 3. A DC sputtering method or the like may be used for formation of the transparent conductive film 4. Meanwhile, the CVD method such as the RF plasma CVD method may be used for formation of the second semiconductor layer 5.

Next, the first semiconductor layer 3, the transparent conductive layer 4, and the second semiconductor layer 5 are partially removed by irradiation of the laser beam. In this way, the second isolation groove 72 for separating each of the first semiconductor layer 3, the transparent conductive layer 4, and the second semiconductor layer 5 are formed as shown in Part (e) of FIG. 3.

Next, the second electrode layer 6 is formed on the inner wall of the second isolation groove 72 and on the second semiconductor layer 5. Specifically, first, as shown in Part (a) of FIG. 4, the first conductive layer 6a is formed on the inner wall of the second isolation groove 72 and on the second semiconductor layer 5. At this time, the first conductive layer 6a is filled on the first electrode layer 2 constituting the bottom surface of the second isolation groove 72, up to at least the A-A line that indicates the interface 45 between the transparent conductive layer 4 and the second semiconductor layer 5. A spin coating method, a spray method, a screen printing method, the CVD method or the like may be used for formation of the first conductive layer 6a. Next, as shown in Part (b) of FIG. 4, the second conductive layer 6b is formed on the first conductive layer 6a by the DC sputtering method or the like. In this way, the second electrode layer 6 is formed.

Next, the second electrode layer 6, the second semiconductor layer 5, the transparent conductive layer 4 and the first semiconductor layer 3 are partially removed by irradiation of the laser beam in a position opposite from the first isolation groove 71 across second isolation groove 72. In this way, the third isolation groove 73 for separating each of the second electrode layer 6, the second semiconductor layer 5, the transparent conductive layer 4, and the first semiconductor layer 3 are formed as shown in Part (c) of FIG. 4. The solar cell module 10 is manufactured as described above.

<Operations and Effects>

In the solar cell module 10 according to the first embodiment of the present invention, since the resistivity of the second conductive layer 6b included in the second electrode layer 6 is lower than the resistivity of the first conductive layer 6a included in the second electrode layer 6, the current generated in the first semiconductor layer 3 and the second semiconductor layer 5 mainly flows along the second conductive layer 6b.

Here, in the solar cell module 10 according to the first embodiment of the present invention, the first conductive layer 6a is filled on the first electrode layer 2 constituting the bottom surface of the second isolation groove 72, up to at least the A-A line that indicates the interface 45 between the transparent conductive layer 4 and the second semiconductor layer 5. According to this structure, the transparent conductive layer 4 is isolated from the second conductive layer 6b by the first conductive layer 6a having the higher resistivity than the second conductive layer 6b. Hence a distance between the transparent conductive layer 4 and the second conductive layer 6b becomes longer.

For this reason, the current flowing along the second conductive layer 6b does not easily flow toward the transparent conductive layer 4. That is, according to the solar cell module 10 of the first embodiment of the present invention, it is possible to prevent occurrence of a leak current between the second electrode layer 6 and the transparent conductive layer 4 without forming a groove for separating the transparent conductive layer 4 between the first isolation groove 71 and the second isolation groove 72.

Therefore, according to the solar cell module 10 of the first embodiment of the present invention, in comparison with the case where such a groove for separating the transparent conductive layer 4 is formed between the first isolation groove 71 and the second isolation groove 72, it is possible to prevent occurrence of a leak current between the transparent conductive layer 4 in the effective region 10a and the second electrode layer 6 without increasing the width between the first isolation groove 71 and the second isolation groove 72, i.e., the width of the second region 10b.

Moreover, it is preferable to form the first conductive layer 6a of a resin containing the conductive filler. According to this structure, the sheet resistance value of the first conductive layer 6a can be set lower than the sheet resistance value of the transparent conductive layer 4, and thereby occurrence of the leak current between the second electrode layer 6 and the transparent conductive layer 4 can be prevented further.

Other Embodiments

Although the present invention has been described with reference to the above embodiment, it should not be understood that the description and the drawings constituting part of this disclosure limit this invention. According to this disclosure, various alternative embodiments, examples, and operation techniques may be obvious to those skilled in the art.

For example, in the above-described first embodiment, the structure in which the solar cell module 10 generates the photogenerated carriers by use of the light incident from the substrate 1 side toward the second electrode layer 6 side has been explained. However, the invention is not limited to this. Specifically, by using a transparent material as the second electrode layer 6, the solar cell module 10 may have a structure in which the photogenerated carriers are generated by use of light incident from the second electrode layer 6 side toward the substrate 1. In this case, it is preferable that the second semiconductor layer 5 have a pin junction in which a p-type semiconductor, an i-type amorphous silicon semiconductor, and an n-type semiconductor are deposited from the second electrode layer 6 side, and that the first semiconductor layer 3 have a pin junction in which a p-type semiconductor, an i-type microcrystalline silicon semiconductor, and an n-type semiconductor are deposited from the second electrode layer 6 side.

Meanwhile, in the above-described first embodiment, each of the first semiconductor layer 3 and the second semiconductor layer 5 includes the single pin junction. However, the invention is not limited to this. Specifically, the first semiconductor layer 3 or the second semiconductor layer 5 may include two or more pin junctions.

Meanwhile, in the above-described first embodiment, the first semiconductor layer 3 contains the amorphous silicon semiconductor as the main component. However, the invention is not limited to this. Specifically, the first semiconductor layer 3 may contain a crystalline silicon semiconductor as the main component. Here, the crystalline silicon semiconductor is supposed to include microcrystalline silicon or polycrystalline silicon. Moreover, in the above-described first embodiment, the second semiconductor layer 5 contains the microcrystalline silicon semiconductor as the main component. However, the invention is not limited to this. Specifically, the second semiconductor layer 5 may contain the amorphous silicon semiconductor as the main component.

Meanwhile, in the above-described first embodiment, the first semiconductor layer 3 and the second semiconductor layer 5 include the pin junction. However, the invention is not limited to this. Specifically, a pn junction formed by depositing a p-type silicon semiconductor and an n-type silicon semiconductor from the substrate 1 side may be included in at least one of the first semiconductor layer 3 and the second semiconductor layer 5.

Meanwhile, in the above-described method of manufacturing the solar cell module 10 according to the first embodiment, the description has been given of the manufacturing method by which the step of forming the first conductive layer 6a on the second semiconductor layer 5 and the step of forming the first conductive layer 6a on the inner wall of the second isolation groove 72 are implemented at the same time. However, these steps do not have to be implemented at the same time. It is also possible to implement the step of forming the first conductive layer 6a on the inner wall of the second isolation groove 72 after implementing the step of forming the first conductive layer 6a on the second semiconductor layer 5.

As described above, it is needless to say that the present invention encompasses various embodiments that are not expressly stated herein. Therefore, the technical scope of the present invention shall be determined solely by constituent features of the invention according to a scope of claims appropriate for the above descriptions.

EXAMPLES

A solar cell module according to the present invention will be concretely described below by taking an example. It is to be noted, however, that the present invention is not limited to the following example and various modifications can be carried out without changing the spirit of the scope thereof.

Example

The solar cell module 10 according to an example was fabricated as described below.

First, an SnO$_2$ layer (the first electrode layer 2) having a uneven structure was formed on a glass substrate (the substrate 1).

Next, part of the SnO$_2$ layer (the first electrode layer 2) was removed by irradiation of an Nd:YAG laser beam from the SnO$_2$ layer (the first electrode layer 2) side. In this way, a first isolation groove (the first isolation groove 71) for separating the SnO$_2$ layer (the first electrode layer 2) was formed. A fundamental wave having a wavelength of 1064 nm was used as the Nd:YAG laser beam. Meanwhile, the width of the first isolation groove (the first isolation groove 71) was set to 40 µm.

Next, a first cell (the first semiconductor layer 3) was formed on the SnO$_2$ layer (the first electrode layer 2) by the RF plasma CVD method and the first cell (the first semiconductor layer 3) was filled into the first isolation groove (the first isolation groove 71). Specifically, a p-type amorphous silicon semiconductor, an i-type amorphous silicon semiconductor, and an n-type amorphous silicon semiconductor were sequentially deposited. The thickness of the i-type amorphous silicon semiconductor was set to 250 nm.

Next, a ZnO layer (the transparent conductive layer 4) containing Al as a dopant was formed on the first cell (the first semiconductor layer 3) by the DC sputtering method. The thickness of the ZnO layer (the transparent conductive layer 4) was set to 50 nm. Meanwhile, the sheet resistance value of the ZnO layer (the transparent conductive layer 4) was set to 150 kΩ/□.

Next, a second cell (the second semiconductor layer 5) was formed on the ZnO layer (the transparent conductive layer 4) by the RF plasma CVD method. Specifically, a p-type microcrystalline silicon semiconductor, an i-type microcrystalline silicon semiconductor, and an n-type microcrystalline silicon semiconductor were sequentially deposited. The thickness of the i-type microcrystalline silicon semiconductor was set to 2000 nm.

Next, the first cell (the first semiconductor layer 3), the ZnO layer (the transparent conductive layer 4), and the second cell (the second semiconductor layer 5) were partially removed by irradiation of an Nd:YAG laser beam from the glass substrate (the substrate 1) side. In this way, a second isolation groove (the second isolation groove 72) for separating each of the first cell (the first semiconductor layer 3), the ZnO layer (the transparent conductive layer 4), and the second cell (the second semiconductor layer 5) was formed. A second harmonic having a wavelength of 532 nm was used as the Nd:YAG laser beam. Meanwhile, the width of the second isolation groove (the second isolation groove 7b) was set to 50 µm.

Next, an acrylic resin layer (the first conductive layer 6a) including the conductive filler mainly containing indium oxide (In$_2$O$_3$) was formed on the inner wall of the second isolation groove (the second isolation groove 72) and continuously on the second cell (the second semiconductor layer 5) by a spin coating method. At this time, the thickness of the acrylic resin layer (the first conductive layer 6a) on the SnO$_2$ layer (the first electrode layer 2) constituting the bottom surface of the second isolation groove (the second isolation groove 72) was set to 1 µm. In this way, the acrylic resin layer (the first conductive layer 6a) was filled, exceeding the A-A line indicating the position of the interface between the ZnO layer (the transparent conductive layer 4) and the second cell (the second semiconductor layer 5), and the thickness of the acrylic resin layer (the first conductive layer 6a) formed on the SnO$_2$ layer (the first electrode layer 2) constituting the bottom surface of the second isolation groove (the second isolation groove 72) became about one-fiftieth of the width of the second isolation groove 72. Meanwhile, the thickness of the acrylic resin layer (the first conductive layer 6a) on the second cell (the second semiconductor layer 5) was set to 70 nm.

Grain size distribution of the conductive filler contained in the acrylic resin layer (the first conductive layer 6a) was set in a range from 20 nm to 50 nm. Meanwhile, the volume occupancy of the conductive filler in the acrylic resin layer (the first conductive layer 6a) was set to about 80% of the volume of the acrylic resin layer (the first conductive layer 6a) containing the conductive filler. In this way, a refractive index n of the acrylic resin layer (the first conductive layer 6a) formed on the SnO$_2$ layer (the first electrode layer 2) constituting the bottom surface of the second isolation groove (the second isolation groove 72) became 1.545, the sheet resistance value thereof became 120 kΩ/□, and density thereof became 2.4 g/cm$^3$.

Next, an Ag layer (the second conductive layer 6b) was formed on the acrylic resin layer (the first conductive layer 6a) by the DC sputtering method. The thickness of the Ag layer (the second conductive layer 6b) was set to 200 nm.

Next, the Ag layer (the second conductive layer 6b), the acrylic resin layer (the first conductive layer 6a), the second cell (the second semiconductor layer 5), the ZnO layer (the transparent conductive layer 4), and the first cell (the first semiconductor layer 3) were partially removed by irradiation of an Nd:YAG laser beam from the glass substrate (the substrate 1) side onto a position opposite from the first isolation groove (the first isolation groove 71) across the second isolation groove (the second isolation groove 72). In this way, a third isolation groove (the third isolation groove 73) for separating each of the Ag layer (the second conductive layer 6b), the acrylic resin layer (the first conductive layer 6a), the second cell (the second semiconductor layer 5), the ZnO layer (the transparent conductive layer 4), and the first cell (the first semiconductor layer 3) was formed. The second harmonic having the wavelength of 532 nm was used as the Nd:YAG laser beam. Meanwhile, the width of the third isolation groove (the third isolation groove 73) was set to 50 µm.

As described above, in this example, the solar cell module 10 was fabricated. As shown in Part (c) of FIG. 4, in the solar cell module 10, the acrylic resin layer (the first conductive layer 6a) was filled, exceeding the A-A line indicating the position of the interface between the ZnO layer (the transparent conductive layer 4) and the second cell (the second semiconductor layer 5), on the SnO$_2$ layer (the first electrode layer 2) constituting the bottom surface of the second isolation groove (the second isolation groove 72).

Comparative Example 1

A solar cell module 20 according to Comparative Example 1 was fabricated as described below.

First, an SnO$_2$ layer (the first electrode layer 2) having a uneven structure was formed on a glass substrate (the substrate 1).

Next, part of the SnO$_2$ layer (the first electrode layer 2) was removed by irradiation of an Nd:YAG laser beam from the SnO$_2$ layer (the first electrode layer 2) side. In this way, a first isolation groove (the first isolation groove 71) for separating the SnO₂ layer (the first electrode layer 2) was formed. As similar to the above-described example, the fundamental wave having the wavelength of 1064 nm was used as the Nd:YAG laser beam, and the width of the first isolation groove (the first isolation groove 71) was set to 40 μm.

Next, a first cell (the first semiconductor layer 3) was formed on the SnO₂ layer (the first electrode layer 2) by the RF plasma CVD method and the first cell (the first semiconductor layer 3) was filled into the first isolation groove (the first isolation groove 71). Specifically, a p-type amorphous silicon semiconductor, an i-type amorphous silicon semiconductor, and an n-type amorphous silicon semiconductor were sequentially deposited. The thickness of the i-type amorphous silicon semiconductor was set to 250 nm.

Next, a ZnO layer (the transparent conductive layer 4) containing Al as a dopant was formed on the first cell (the first semiconductor layer 3) by the DC sputtering method. The thickness of the ZnO layer (the transparent conductive layer 4) was set to 50 nm.

Next, the first cell (the first semiconductor layer 3) and the ZnO layer (the transparent conductive layer 4) were partially removed by irradiation of an Nd:YAG laser beam from the glass substrate (the substrate 1) side onto a position not overlapping with first isolation groove (the first isolation groove 71). In this way, a ZnO layer isolation groove (a transparent conductive layer isolation groove 8) for separating the first cell (the first semiconductor layer 3) and the ZnO layer (the transparent conductive layer 4) was formed. The second harmonic having the wavelength of 532 nm was used as the Nd:YAG laser beam. Meanwhile, the width of the ZnO layer isolation groove (the transparent conductive layer isolation groove 8) was set to 50 μm.

Next, a second cell (the second semiconductor layer 5) was formed on the ZnO layer (the transparent conductive layer 4) by the RF plasma CVD method and the second cell (the second semiconductor layer 5) was filled into the ZnO layer isolation groove (the transparent conductive layer isolation groove 8). Specifically, a p-type microcrystalline silicon semiconductor, an i-type microcrystalline silicon semiconductor, and an n-type microcrystalline silicon semiconductor were sequentially deposited. The thickness of the i-type microcrystalline silicon semiconductor was set to 2000 nm.

Next, the first cell (the first semiconductor layer 3), the ZnO layer (the transparent conductive layer 4), and the second cell (the second semiconductor layer 5) were partially removed by irradiation of an Nd:YAG laser beam from the glass substrate (the substrate 1) side onto a position opposite from the first isolation groove (the first isolation groove 71) across the ZnO layer isolation groove (the transparent conductive layer isolation groove 8). In this way, a second isolation groove (the second isolation groove 72) for separating each of the first cell (the first semiconductor layer 3), the ZnO layer (the transparent conductive layer 4), and the second cell (the second semiconductor layer 5) was formed. As similar to the above-described example, the second harmonic having the wavelength of 532 nm was used as the Nd:YAG laser beam, and the width of the second isolation groove (the second isolation groove 72) was set to 50 μm.

Next, an ITO layer (the first conductive layer 6a) was formed on the inner wall of the second isolation groove (the second isolation groove 72) and continuously on the second cell (the second semiconductor layer 5) by the DC sputtering method. The thickness of the ITO layer (the first conductive layer 6a) was set to 70 nm uniformly on the inner wall of the second isolation groove (the second isolation groove 72) and continuously on the second cell (the second semiconductor layer 5). A refractive index n of the ITO layer (the first conductive layer 6a) became 1.8.

Next, an Ag layer (the second conductive layer 6b) was formed on the ITO layer (the first conductive layer 6a) by the DC sputtering method. The thickness of the Ag layer (the second conductive layer 6b) was set to 200 nm.

Next, the Ag layer (the second conductive layer 6b), the ITO layer (the first conductive layer 6a), the second cell (the second semiconductor layer 5), the ZnO layer (the transparent conductive layer 4), and the first cell (the first semiconductor layer 3) were partially removed by irradiation of an Nd:YAG laser beam from the glass substrate (the substrate 1) side onto a position opposite from the first isolation groove (the first isolation groove 71) across the second isolation groove (the second isolation groove 72). In this way, a third isolation groove (the third isolation groove 73) for separating each of the Ag layer (the second conductive layer 6b), the ITO layer (the first conductive layer 6a), the second cell (the second semiconductor layer 5), the ZnO layer (the transparent conductive layer 4), and the first cell (the first semiconductor layer 3) was formed. As similar to the above-described example, the second harmonic having the wavelength of 532 nm was used as the Nd:YAG laser beam, and the width of the third isolation groove (the third isolation groove 73) was set to 50 μm.

Figure 5:
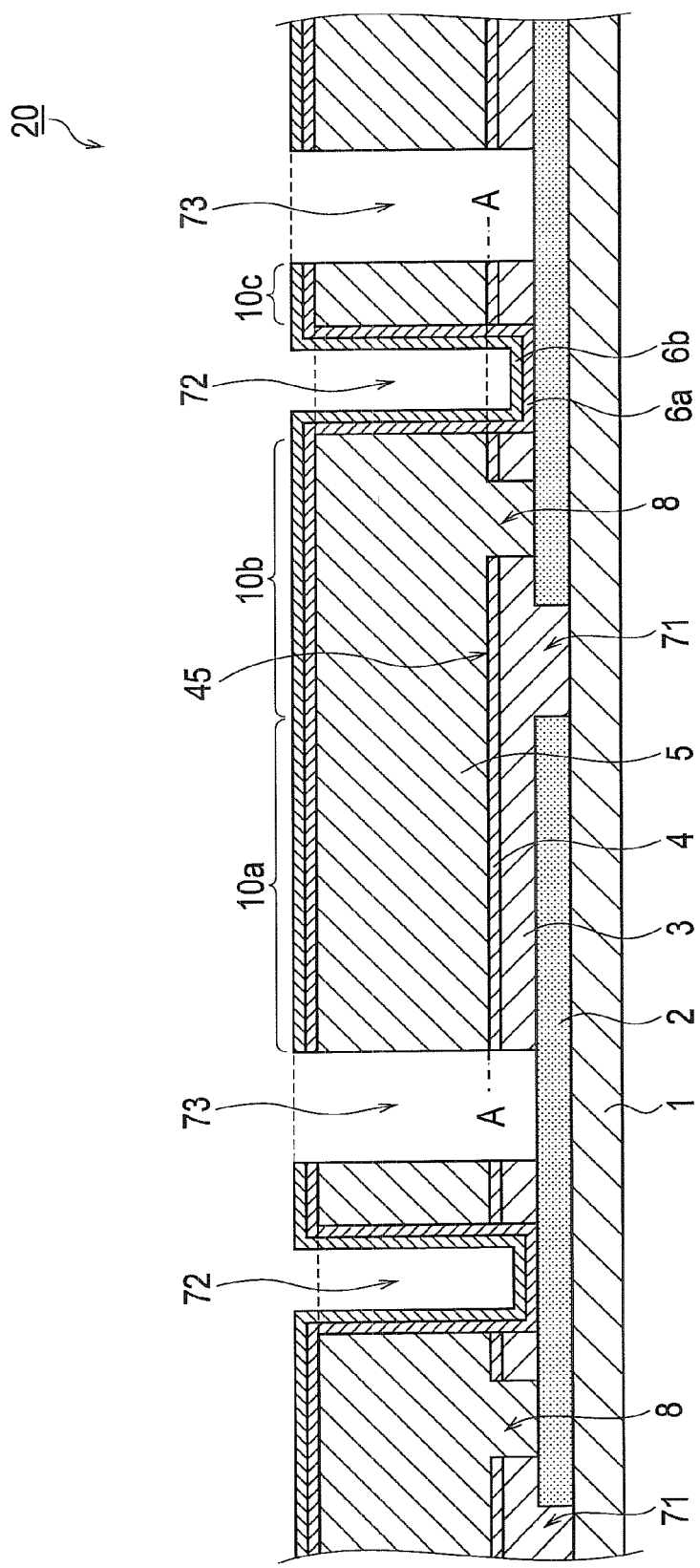
FIG. 5 is a cross-sectional view of a solar cell module 20 according to Comparative Example 1.

As described above, in this Comparative Example 1, the solar cell module 20 was fabricated. As shown in FIG. 5, in the solar cell module 20, the ZnO layer isolation groove (the transparent conductive layer isolation groove 8) for separating the ZnO layer (the transparent conductive layer 4) was provided and the ITO layer (the first conductive layer 6a) was not filled up to the A-A line indicating the position of the interface between the ZnO layer (the transparent conductive layer 4) and the second cell (the second semiconductor layer 5), onto the SnO₂ layer (the first electrode layer 2) constituting the bottom surface of the second isolation groove (the second isolation groove 72).

Comparative Example 2

A solar cell module 20 according to Comparative Example 2 was fabricated as described below.

First, a SnO₂ layer (the first electrode layer 2) having a uneven structure was formed on a glass substrate (the substrate 1).

Next, part of the SnO₂ layer (the first electrode layer 2) was removed by irradiation of an Nd:YAG laser beam from the SnO₂ layer (the first electrode layer 2) side. In this way, a first isolation groove (the first isolation groove 71) for separating the SnO₂ layer (the first electrode layer 2) was formed. As similar to the above-described example, the fundamental wave having the wavelength of 1064 nm was used as the Nd:YAG laser beam, and the width of the first isolation groove (the first isolation groove 71) was set to 40 μm.

Next, a first cell (the first semiconductor layer 3) was formed on the SnO₂ layer (the first electrode layer 2) by the RF plasma CVD method, and the first cell (the first semiconductor layer 3) was filled into the first isolation groove (the first isolation groove 71). Specifically, a p-type amorphous silicon semiconductor, an i-type amorphous silicon semiconductor, and an n-type amorphous silicon semiconductor were sequentially deposited. The thickness of the i-type amorphous silicon semiconductor was set to 250 nm.

Next, a ZnO layer (the transparent conductive layer 4) containing Al as a dopant was formed on the first cell (the first semiconductor layer 3) by the DC sputtering method. The thickness of the ZnO layer (the transparent conductive layer 4) was set to 50 nm.

Next, a second cell (the second semiconductor layer 5) was formed on the ZnO layer (the transparent conductive layer 4) by the RF plasma CVD method. Specifically, a p-type microcrystalline silicon semiconductor, an i-type microcrystalline silicon semiconductor, and an n-type microcrystalline silicon semiconductor were sequentially deposited. The thickness of the i-type microcrystalline silicon semiconductor was set to 2000 nm.

Next, the first cell (the first semiconductor layer 3), the ZnO layer (the transparent conductive layer 4), and the second cell (the second semiconductor layer 5) were partially removed by irradiation of an Nd:YAG laser beam from the glass substrate (the substrate 1) side. In this way, a second isolation groove (the second isolation groove 72) for separating each of the first cell (the first semiconductor layer 3), the ZnO layer (the transparent conductive layer 4), and the second cell (the second semiconductor layer 5) was formed. As similar to the above-described example, the second harmonic having the wavelength of 532 nm was used as the Nd:YAG laser beam. Meanwhile, the width of the second isolation groove (the second isolation groove 7b) was set to 50 μm.

Next, an ITO layer (the first conductive layer 6a) was formed on the inner wall of the second isolation groove (the second isolation groove 72) and continuously on the second cell (the second semiconductor layer 5) by the DC sputtering method. The thickness of the ITO layer (the first conductive layer 6a) was set to 70 nm uniformly on the inner wall of the second isolation groove (the second isolation groove 72) and continuously on the second cell (the second semiconductor layer 5). A refractive index n of the ITO layer (the first conductive layer 6a) became 1.8.

Next, an Ag layer (the second conductive layer 6b) was formed on the ITO layer (the first conductive layer 6a) by the DC sputtering method. The thickness of the Ag layer (the second conductive layer 6b) was set to 200 nm.

Next, the Ag layer (the second conductive layer 6b), the ITO layer (the first conductive layer 6a), the second cell (the second semiconductor layer 5), the ZnO layer (the transparent conductive layer 4), and the first cell (the first semiconductor layer 3) were partially removed by irradiation of an Nd:YAG laser beam from the glass substrate (the substrate 1) side onto a position opposite from the first isolation groove (the first isolation groove 71) across the second isolation groove (the second isolation groove 72). In this way, a third isolation groove (the third isolation groove 73) for separating each of the Ag layer (the second conductive layer 6b), the ITO layer (the first conductive layer 6a), the second cell (the second semiconductor layer 5), the ZnO layer (the transparent conductive layer 4), and the first cell (the first semiconductor layer 3) was formed. As similar to the above-described example, the second harmonic having the wavelength of 532 nm was used as the Nd:YAG laser beam, and the width of the third isolation groove (the third isolation groove 73) was set to 50 μm.

Figure 6:
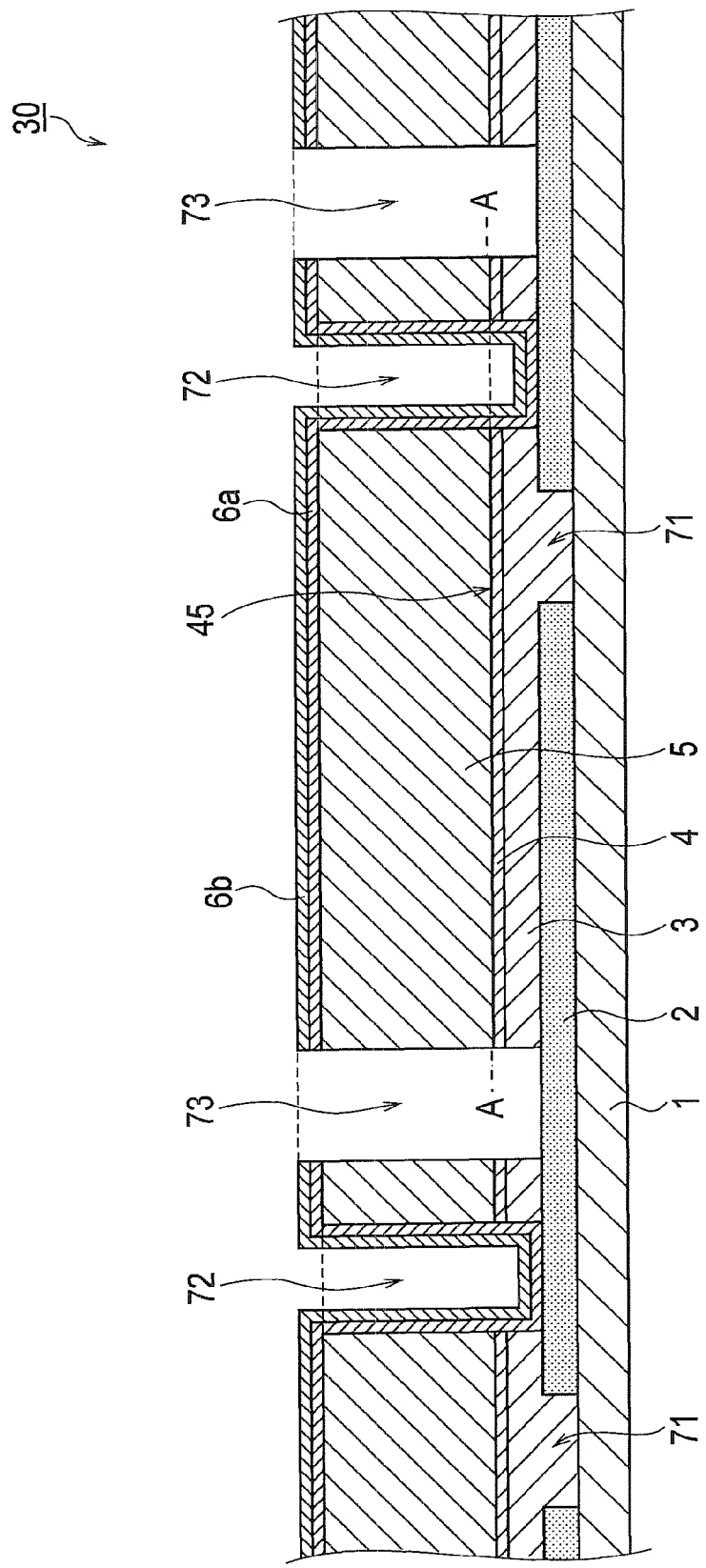
FIG. 6 is a cross-sectional view of a solar cell module 30 according to Comparative Example 2.

As described above, in this Comparative Example 2, the solar cell module 30 was fabricated. As shown in FIG. 6, in the solar cell module 30, the ITO layer (the first conductive layer 6a) was not filled up to the A-A line indicating the position of the interface between the ZnO layer (the transparent conductive layer 4) and the second cell (the second semiconductor layer 5), onto the $SnO_2$ layer (the first electrode layer 2) constituting the bottom surface of the second isolation groove (the second isolation groove 72).

<Evaluation of Output Characteristics>

Next, characteristic values of open-circuit voltages $V_{OC}$, short-circuit currents $I_{SC}$, fill factors FF, output values Pmax, and widths of small voltage potential difference region were compared between the solar cell modules according to the Example and the Comparative Example 1. Results of comparison are shown on Table 1. Measurement conditions of the characteristic values were set to AM 1.5, 100 mW/cm², and 25° C. Note that Table 1 shows the open-circuit voltage $V_{OC}$, the short-circuit current $I_{SC}$, the fill factor FF, and the output value Pmax of the solar cell module 10 according to Example as values, based on standardization as 1.00 of each value of the open-circuit voltage $V_{OC}$, the short-circuit current $I_{SC}$, the fill factor FF, and the output value Pmax of the solar cell module 20 according to Comparative Example 1.

Moreover, in Table 1 below, a second region width (μm) indicates the width of the second region 10b where it was difficult to take out the current generated in the first cell (the first semiconductor layer 3) and the second cell (the second semiconductor layer 5).

TABLE 1

| | Characteristic values of the solar cell modules according to Example and Comparative Example 1 | | | | |
|---|---|---|---|---|---|
| | Open-circuit voltage Voc | Short-circuit current Isc | Fill factor FF | Output value Pmax | Second region width (μm) |
| Example | 1.018 | 1.030 | 1.131 | 1.188 | 110 |
| Comparative Example 1 | 1.000 | 1.000 | 1.000 | 1.000 | 250 |

As shown in Table 1, the output value Pmax of the solar cell module 10 according to Example marks a higher value than the output value Pmax of the solar cell module 20 according to Comparative Example 1.

This is because the solar cell module 10 according to Example can prevent occurrence of a leak current between the ZnO layer (the transparent conductive layer 4) and the second cell (the second semiconductor layer 5) without increasing the width of the small voltage potential difference region as compared to the solar cell module 20 according to Comparative Example 1.

From these results, it was confirmed that occurrence of the leak current between the ZnO layer (the transparent conductive layer 4) and the second cell (the second semiconductor layer 5) can be prevented in the solar cell module according to Example: by setting the resistivity (resistivity=about 0.1 Ω·m) of the acrylic resin layer (the first conductive layer 6a) to be higher than the resistivity (resistivity=about 1.6×10-8 Ω·m) of the Ag layer (the second conductive layer 6b) while setting the sheet resistance value (sheet resistance value=120 kΩ/□) of the acrylic resin layer (the first conductive layer 6a) to be lower than the sheet resistance value (sheet resistance value=150 kΩ/□) of the ZnO layer (the transparent conductive layer 4); and by setting the thickness of the acrylic resin layer (the first conductive layer 6a) to be formed on the SnO$_2$ layer (the first electrode layer 2) constituting the bottom surface of the second isolation groove (the second isolation groove 72) to about one-fiftieth of the width of the second isolation groove 72.

<Evaluation of Collection Efficiency>

Figure 7:
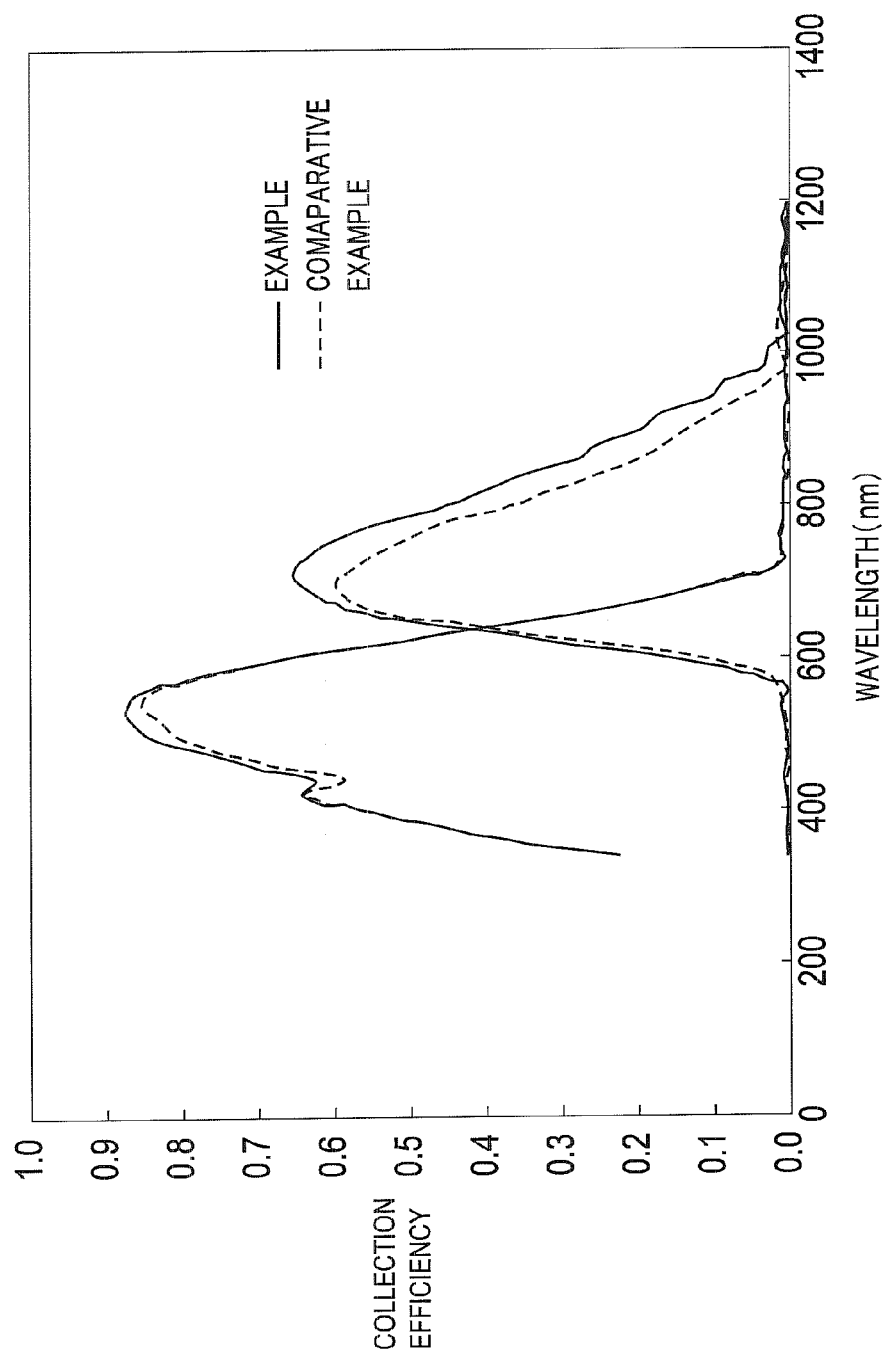
FIG. 7 is a view showing collection efficiency of the solar cell modules according to Example and Comparative Example 2.

Collection efficiency was compared between the solar cell modules according to Example and Comparative Example 2. FIG. 7 is a view showing the collection efficiency of the solar cell modules according to Example and Comparative Example 2.

As shown in FIG. 7, the collection efficiency of the solar cell module 10 according to Example marks a higher value than the collection efficiency of the solar cell module 30 according to Comparative Example 2.

This is because the refractive index (n=1.545) of the acrylic resin layer (the first conductive layer 6a) in the solar cell module 10 according to Example became lower than the refractive index (n=1.8) of the ITO resin layer (the first conductive layer 6a) in the solar cell module 30 according to Comparative Example 2, and thereby the optical reflectivity on the interface between the acrylic resin layer (the first conductive layer 6a) and the second cell (the second semiconductor layer 5) of the solar cell module 10 according to Example became higher than the optical reflectivity on the interface between the ITO layer (the first conductive layer 6a) and the second cell (the second semiconductor layer 5) of the solar cell module 30 according to Comparative Example 2.

<Evaluation of Moisture Resistance>

Next, the solar cell modules according to Example and Comparative Example 2 were subjected to a moisture resistance test. Table 2 shows characteristic values of the open-circuit voltages V$_{OC}$, the short-circuit currents I$_{SC}$, the fill factors FF, and the output values Pmax of the solar cell modules according to Example and Comparative Example 2 after the moisture resistance test. Test conditions were set at a temperature of 85° C. and a humidity of 85%, and a test period was set to 2000 hours.

Note that Table 2 shows the open-circuit voltage V$_{OC}$, the short-circuit current I$_{SC}$, the fill factor FF, and the output value Pmax of the solar cell module 10 according to Example as values, based on standardization as 1.00 of each value of the open-circuit voltage V$_{OC}$, the short-circuit current I$_{SC}$, the fill factor FF, and the output value Pmax of the solar cell module 30 according to Comparative Example 2 as 1.00.

TABLE 2

Characteristic values of the solar cell modules according to Example and Comparative Example 2 after the moisture resistance test

| | Open-circuit voltage Voc | Short-circuit current Isc | Fill factor FF | Output value Pmax |
|---|---|---|---|---|
| Example | 1.013 | 0.998 | 1.092 | 1.106 |
| Comparative Example 2 | 1.000 | 1.000 | 1.000 | 1.000 |

As shown in Table 2, the output value Pmax of the solar cell module 10 according to Example after the moisture resistance test marks a higher value than the output value Pmax of the solar cell module 20 according to Comparative Example 2 after the moisture resistance test.

Here, when conditions of the solar cell modules after the moisture resistance test were checked, moisture entered the solar cell module 30 according to Comparative Example 2 along the second isolation groove (the second isolation groove 72). By contrast, very little moisture entered the vicinity of the second isolation groove (the second isolation groove 72) of the solar cell module 10 according to Example.

Therefore, in the solar cell module 10 according to Example, it was confirmed that entry of moisture along the second isolation groove (the second isolation groove 72) can be prevented by filling the acrylic resin layer (the first conductive layer 6a) so as to exceed the A-A line indicating the position of the interface between the ZnO layer (the transparent conductive layer 4) and the second cell (the second semiconductor layer 5), on the SnO$_2$ layer (the first electrode layer 2) constituting the bottom surface of the second isolation groove (the second isolation groove 72). For this reason, in the solar cell module 10 according to Example, it was confirmed that deterioration of the solar cell module 10 attributable to moisture can be prevented in comparison with the solar cell module 30 according to Comparative Example 2.

INDUSTRIAL APPLICABILITY

As described above, according to the present invention, it is possible to provide a solar cell module capable of preventing occurrence of a leak current between a transparent conductive layer and a second electrode layer without increasing a width of a small voltage potential difference region. Hence it was useful in the field of photovoltaic power generation.

The invention claimed is:

1. A solar cell module formed by depositing a first electrode layer, a first semiconductor layer, a transparent conductive layer, a second semiconductor layer, and a second electrode layer sequentially on a principal surface of a substrate, the solar cell module comprising:
    a first isolation groove for separating the first electrode layer;
    a second isolation groove for separating each of the first semiconductor layer, the transparent conductive layer, and the second semiconductor layer; and
    a third isolation groove formed in a position opposite from the first isolation groove across the second isolation groove and for separating each of the second electrode layer, the second semiconductor layer, the transparent conductive layer, and the first semiconductor layer, wherein
    the second electrode layer includes:
        a first conductive layer formed on the first electrode layer constituting a bottom surface of the second isolation groove, on an inner wall of the second isolation groove, and on the second semiconductor layer; and
        a second conductive layer formed on the first conductive layer,
            a resistivity of the first conductive layer is higher than a resistivity of the second conductive layer, and
        the first conductive layer is filled on the first electrode layer constituting the bottom surface of the second isolation groove so that the first conductive layer is higher than or equal to at least a position of an interface between the transparent conductive layer and the second semiconductor layer and lower than a position of an upper surface of the second semiconductor layer.

2. The solar cell module according to claim 1, wherein the substrate has transparency, the first semiconductor layer comprises a power generation layer formed of an amorphous-silicon-based semiconductor, and the second semiconductor layer comprises a power generation layer formed of a microcrystalline-silicon-based semiconductor.

3. The solar cell module according to claim 1, wherein the first conductive layer is formed of resin containing a conductive particle.

* * * * *